(12) United States Patent
Dening

(10) Patent No.: US 6,624,702 B1
(45) Date of Patent: Sep. 23, 2003

(54) AUTOMATIC $V_{CC}$ CONTROL FOR OPTIMUM POWER AMPLIFIER EFFICIENCY

(75) Inventor: David Dening, Stokesdale, NC (US)

(73) Assignee: RF Micro Devices, Inc., Greensboro, NC (US)

( * ) Notice: Subject to any disclaimer, the term of this patent is extended or adjusted under 35 U.S.C. 154(b) by 0 days.

(21) Appl. No.: 10/116,918

(22) Filed: Apr. 5, 2002

(51) Int. Cl.[7] .................................................. H03F 3/04
(52) U.S. Cl. ........................................ 330/297; 330/285
(58) Field of Search ................................. 330/285, 297, 330/298, 207 P

(56) References Cited

U.S. PATENT DOCUMENTS

| | | | |
|---|---|---|---|
| 3,109,992 A | 11/1963 | Elliott | 329/178 |
| 3,274,505 A | 9/1966 | Frisch et al. | 330/18 |
| 3,374,442 A | 3/1968 | Griffin | 330/40 |
| 3,967,207 A | 6/1976 | Wheatley, Jr. | 330/23 |
| 4,442,407 A | 4/1984 | Apel | 330/128 |
| 4,523,155 A | 6/1985 | Walczak et al. | 330/279 |
| 4,578,648 A | 3/1986 | Werrbach | 330/281 |
| 4,636,741 A | 1/1987 | Mitzlaff | 330/127 |
| 4,794,343 A | 12/1988 | Yang | 330/2 |
| 5,030,922 A | 7/1991 | Rumreich et al. | 330/253 |
| 5,081,425 A | 1/1992 | Jackson et al. | 330/207 P |
| 5,126,688 A | 6/1992 | Nakanishi et al. | 330/285 |
| 5,138,274 A | 8/1992 | Nakanishi et al. | 330/136 |
| 5,144,258 A | 9/1992 | Nakanishi et al. | 330/129 |
| 5,196,806 A | 3/1993 | Ichihara | 330/137 |
| 5,204,613 A | 4/1993 | Cripps et al. | 324/95 |
| 5,311,143 A | 5/1994 | Soliday | 330/127 |
| 5,381,115 A | 1/1995 | Timmons et al. | 330/279 |
| 5,442,317 A | 8/1995 | Stengel | 330/10 |
| 5,604,924 A * | 2/1997 | Yokoya | 330/297 |
| 5,629,648 A | 5/1997 | Pratt | 330/289 |
| 5,710,519 A | 1/1998 | McCalpin et al. | 327/538 |
| 5,745,016 A | 4/1998 | Salminen | 333/17.1 |
| 5,757,226 A | 5/1998 | Yamada et al. | 327/541 |
| 5,777,519 A | 7/1998 | Simopoulos | 330/297 |
| 5,808,515 A | 9/1998 | Tsuruoka et al. | 330/277 |
| 5,834,977 A | 11/1998 | Maehara et al. | 330/297 |
| 5,892,396 A | 4/1999 | Anderson et al. | 330/129 |
| 5,892,397 A | 4/1999 | Belcher et al. | 330/149 |
| 5,892,403 A | 4/1999 | Brandt | 330/297 |
| 5,955,926 A | 9/1999 | Uda et al. | 330/295 |
| 5,986,509 A | 11/1999 | Lohninger | 330/290 |
| 5,990,751 A | 11/1999 | Takita | 330/297 |
| 6,034,519 A | 3/2000 | Yang | 323/316 |
| 6,052,020 A | 4/2000 | Doyle | 327/539 |
| 6,064,269 A | 5/2000 | Ruppel et al. | 330/297 |
| 6,121,842 A | 9/2000 | Adlerstein et al. | 330/307 |
| 6,148,220 A * | 11/2000 | Sharp et al. | 330/285 |
| 6,150,872 A | 11/2000 | McNeill et al. | 327/539 |
| 6,163,706 A | 12/2000 | Rozenblit et al. | 455/522 |
| 6,201,445 B1 | 3/2001 | Morimoto et al. | 330/295 |
| 6,239,658 B1 * | 5/2001 | Tham | 330/285 |
| 6,242,983 B1 * | 6/2001 | Shiao | 330/285 |
| 6,265,943 B1 | 7/2001 | Dening et al. | 330/296 |
| 6,362,605 B1 * | 3/2002 | May | 330/255 |

* cited by examiner

*Primary Examiner*—Robert Pascal
*Assistant Examiner*—Khanh Van Nguyen
(74) *Attorney, Agent, or Firm*—Withrow & Terranova, PLLC

(57) ABSTRACT

The output power of a power amplifier is sensed, directly or indirectly. The sensed output power is used to control a bias circuit and a DC-DC converter that together control the power amplifier. This control circuit allows the power amplifier to be operated at high efficiencies as output power is changed.

25 Claims, 4 Drawing Sheets

AUTOMATIC $V_{CC}$ CONTROL FOR OPTIMUM POWER AMPLIFIER EFFICIENCY

FIELD OF THE INVENTION

The present invention relates to controlling a power amplifier by manipulation of the $V_{CC}$ input supply voltage and bias set point, and particularly through manipulation of the $V_{CC}$ input supply voltage and bias set point based on an output power from the power amplifier.

BACKGROUND OF THE INVENTION

Wireless communication systems enjoy significant popularity, finding widespread use in both developed and developing regions. Indeed, the very popularity of wireless communication systems spurs their development and advancement, driving system designers and service providers to devise ways of supporting more users within a finite radio frequency spectrum. Existing and pending wireless communications standards typically rely on frequency, code, or time-division multiplexing techniques that allow multiple users of mobile terminals (such as cellular phones) to share the same frequencies within a given service area. Commonly, such access schemes benefit from each mobile terminal controlling its transmitted signal power to help minimize its interference with other active devices in a given wireless service area.

This power control approach presents mobile terminal designers with significant challenges. For example, power control techniques typically require transmit signal amplifier circuits that provide a range of transmit signal gain. This allows the mobile terminal to transmit with a desired signal power based on adjusting the gain of one or more such transmit signal amplifier circuits. For example, as the mobile terminal moves closer to a supporting base station, the wireless communications systems may instruct the mobile terminal, via control signaling, to reduce its transmit power. Essentially, in such wireless communications systems, active mobile terminals are controlled such that they transmit with the minimum necessary signal power at all times.

During this power control activity, the power amplifier may operate at less than full output power to provide the desired continuous transmit signal gain. Unfortunately, when operating at less than full output power, many power amplifiers are not efficient and power is wasted. Because mobile terminals are typically battery-operated, power consumption is of great concern for these devices. Any technique that could extend battery life to provide longer talk time is to be appreciated.

In the past, Doherty amplifiers, load switches and segmented output stages have been used to address efficiency concerns. To date, only the Doherty configuration has provided automatic efficiency compensation as the power is backed off. The other approaches require the intervention of an external controller. These approaches leave something to be desired in terms of simplicity, cost, and results.

SUMMARY OF THE INVENTION

The present invention takes a signal proportional to the RF output power of a power amplifier and controls a DC-DC converter that supplies DC power to a power amplifier, thereby increasing the efficiency of the power amplifier. Specifically, a signal proportional to the output of the power amplifier is used to control the DC-DC converter, thereby controlling the DC power supplied to the power amplifier. A second signal proportional to the output of the power amplifier may control a bias circuit, thereby changing the bias point of the power amplifier.

In a first embodiment, the signal proportional to the output of the power amplifier is created by rectifying a sample of the output signal from the power amplifier. In a second embodiment, the signal proportional to the output of the power amplifier is created by using a power sensed output and a power sensed reference output available on some power amplifier circuits.

The signal proportional to the output of the power amplifier may be used not only to control the DC-DC converter, but also may control a bias control circuit associated with the power amplifier. In one embodiment, a control processing circuit makes the bias control signal a function of the control signal for the DC-DC converter, and the two control signals cooperate to change the bias provided to the power amplifier concurrently with the power control signal to control the power amplifier in a coordinated fashion to increase efficiency.

Those skilled in the art will appreciate the scope of the present invention and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the invention, and together with the description serve to explain the principles of the invention.

DETAILED DESCRIPTION OF THE PREFERRED EMBODIMENTS

The embodiments set forth below represent the necessary information to enable those skilled in the art to practice the invention and illustrate the best mode of practicing the invention. Upon reading the following description in light of the accompanying drawing figures, those skilled in the art will understand the concepts of the invention and will recognize applications of these concepts not particularly addressed herein. It should be understood that these concepts and applications fall within the scope of the disclosure and the accompanying claims.

The present invention is well-suited for use in a mobile terminal such as a cellular phone, and particularly within a transmission chain within a mobile terminal. However, it will be readily apparent to those of ordinary skill in the art that other power amplifiers may also benefit from the teachings herein and the embodiments illustrated are exemplary and not limiting.

Figure 1:
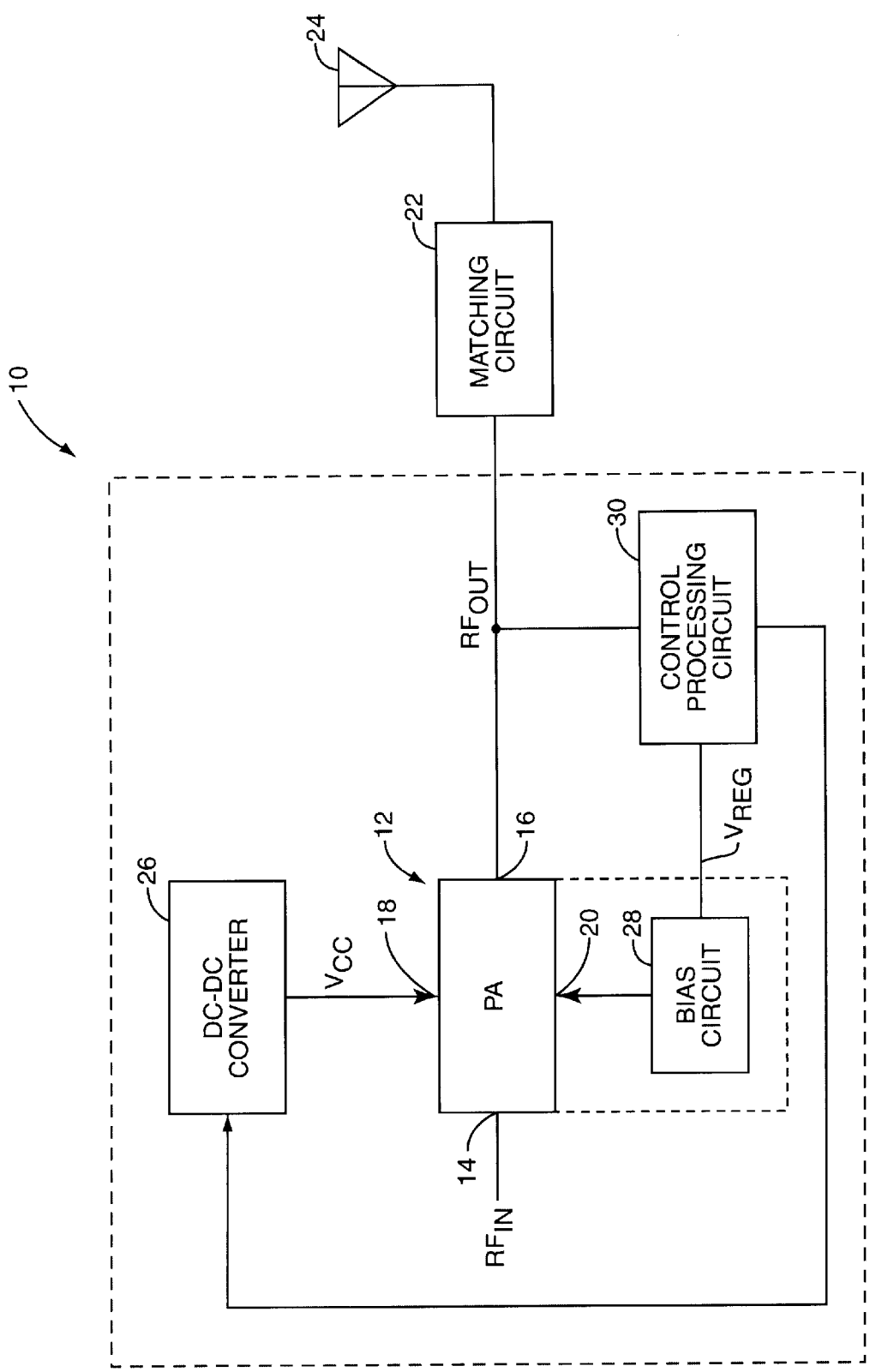
FIG. 1 illustrates a first embodiment of the present invention wherein power is sensed from the power amplifier directly.

FIG. 1 illustrates schematically a first embodiment of the present invention. Specifically, an amplifier circuit 10 comprises a power amplifier 12 having an RF input 14, an RF output 16, a voltage supply input 18, and a bias input 20. RF input 14 receives a radio frequency signal ($RF_{IN}$) to be amplified. The RF output 16 sends an amplified version of the radio frequency signal ($RF_{OUT}$) to a matching circuit 22 prior to transmission through an antenna 24 as is well understood.

The voltage supply input 18 receives a supply voltage $V_{CC}$ from a DC-DC converter 26. In an exemplary embodiment, the DC-DC converter 26 comprises a buck converter, which is sometimes known as a step-down converter. Alternatively, a boost-type DC-DC converter may be used, which is sometimes known as a step-up converter. As still another alternative, a buck-boost converter may be used, which can function as both a step-up and a step-down converter. The DC-DC converter 26 draws upon a battery (not shown) or other power source and converts the battery voltage to the supply voltage $V_{CC}$ for use by the power amplifier 12.

The bias input 20 receives a bias set point signal from a bias circuit 28. In some embodiments, the bias circuit 28 may be incorporated into the same integrated circuit as the amplifying elements. This is illustrated by the broken line extending around the bias circuit 28. The bias circuit 28 preferably outputs a bias set point signal that is a linear function of an input bias voltage $V_{REG}$.

In the prior art, the power amplifier 12 operates at a constant supply voltage $V_{CC}$ and operates inefficiently at low power outputs as comparatively large amounts of power are provided by supply voltage $V_{CC}$ and small $RF_{OUT}$ signals are generated. Likewise, at low power outputs, a constant bias set point results in inefficiency as comparatively large amounts of power are provided by the bias set point and small $RF_{OUT}$ signals are generated.

In contrast, the present invention provides a feedback element which controls the supply voltage $V_{CC}$ and the bias set point as a function of a signal reflective of the $RF_{OUT}$ signal. In one embodiment, the $RF_{OUT}$ signal is split prior to reaching the matching circuit 22 and some portion of the $RF_{OUT}$ signal is coupled to a control processing circuit 30. The remainder of the $RF_{OUT}$ signal is sent to the matching circuit 22 as previously described.

The control processing circuit 30 may comprise Schottky or regular diodes that are used to rectify the $RF_{OUT}$ signal and provide a signal reflective of the output power. In the embodiment illustrated, two signals reflective of the output power are generated by the control processing circuit 30. The first signal is directed to DC-DC converter 26, and the second signal (input bias voltage $V_{REG}$) is directed to the bias circuit 28.

The signal sent to the DC-DC converter 26 changes the conversion function of the DC-DC converter 26 and thus changes the supply voltage $V_{CC}$. When low $RF_{OUT}$ signals are received by the control processing circuit, the first signal generated by the control processing circuit 30 causes the DC-DC converter 26 to generate a lower supply voltage $V_{CC}$. This creates greater efficiencies as less power is consumed by the power amplifier.

Concurrently with the control of the DC-DC converter 26, the second signal (input bias voltage $V_{REG}$) sent to the bias circuit 28 changes the bias set point signal directed to the bias input 20. At low $RF_{OUT}$ signals, the bias set point is cut back and battery drain is reduced. Because of the linear relation between the input bias voltage $V_{REG}$ and the bias set point, appropriate circuitry may be used to scale the input bias voltage $V_{REG}$ as desired to achieve the best efficiency.

In one embodiment, the control processing circuit 30 makes the bias control signal a function of the control signal for the DC-DC converter 26, and the two control signals cooperate to change the bias provided to the power amplifier 12 concurrently with the supply voltage $V_{CC}$ so as to control the power amplifier 12 in a coordinated fashion.

Figure 2:
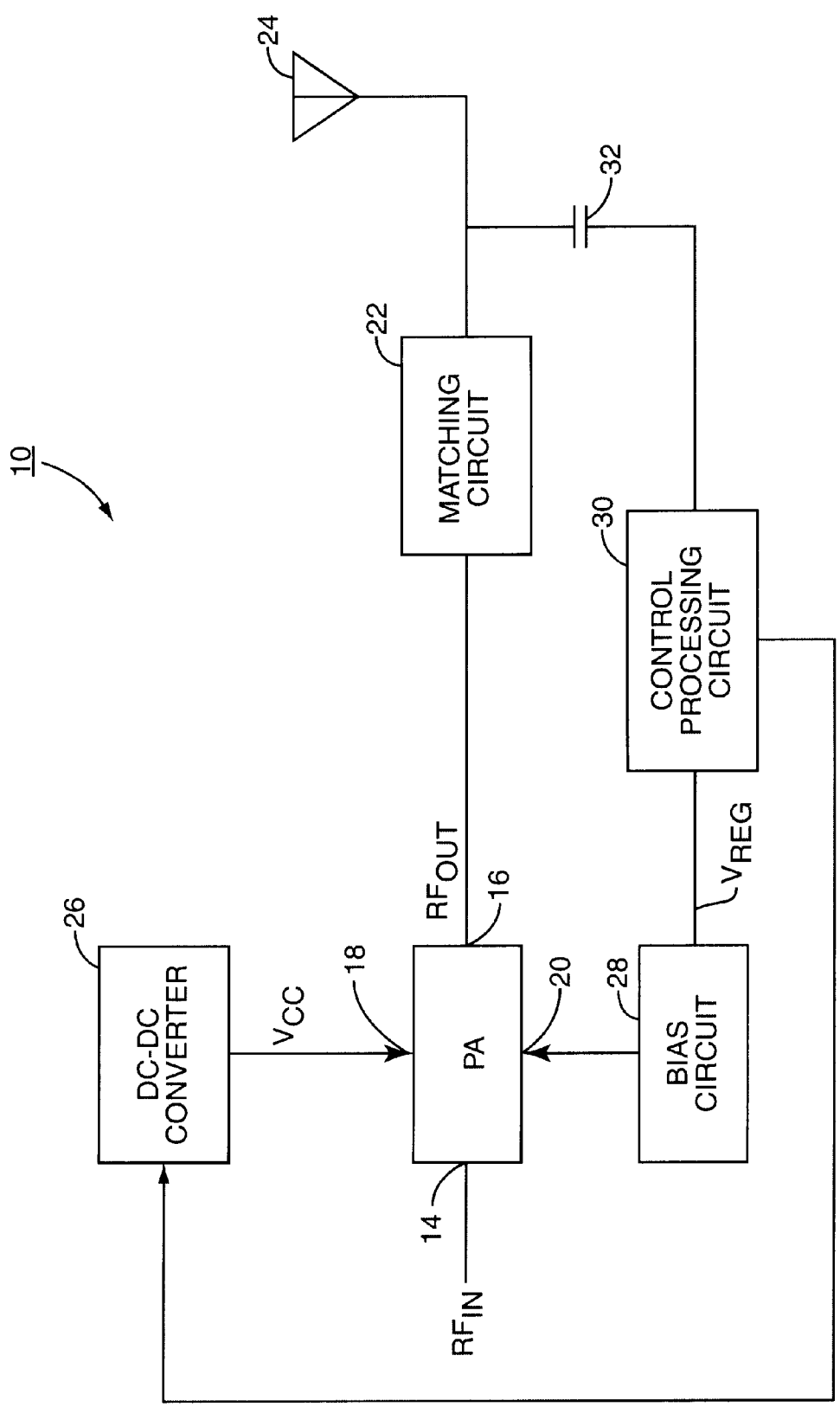
FIG. 2 illustrates a second embodiment of the present invention wherein power is sensed from the power amplifier directly.

A closely related embodiment is illustrated in FIG. 2, wherein the elements are substantially the same, but the $RF_{OUT}$ signal is split after the matching circuit 22. A capacitor 32 may be used to isolate the split path. As yet another alternative, not illustrated, the $RF_{OUT}$ signal is split within the matching circuit 22.

Both the embodiments of FIG. 1 and FIG. 2 are defined herein to be direct sensing of the output power because they directly sample the $RF_{OUT}$ signal and derive therefrom—with control processing circuit 30—a signal reflective of the $RF_{OUT}$ signal. By controlling the bias set point and the supply voltage $V_{CC}$ supplied to the power amplifier 12, the power amplifier 12 may more readily be controlled, and more specifically may be backed off its full power operation with greater efficiency.

While the direct sensing techniques of FIGS. 1 and 2 are adequate, they do cause some loss in the transmitted signal. Thus, a technique by which the $RF_{OUT}$ signal may be sensed indirectly would prove advantageous, so as to avoid such losses. The embodiment of FIGS. 3 and 4 illustrates one such indirect approach.

The assignor of the present invention also owns U.S. patent application Ser. No. 09/952,524, filed Sep. 14, 2001, which is herein incorporated by reference. The '524 application outlines a power amplifier that comprises an array of transistor cells. Another possible arrangement for the power amplifier is illustrated in U.S. Pat. No. 6,265,943, commonly owned, which is also hereby incorporated by reference. While fully explained in the incorporated '524 application and '943 patent, a review of the '524 application power amplifier 40 is illustrated in FIG. 3. This power amplifier 40 is well-suited for use with the present invention.

Figure 3:
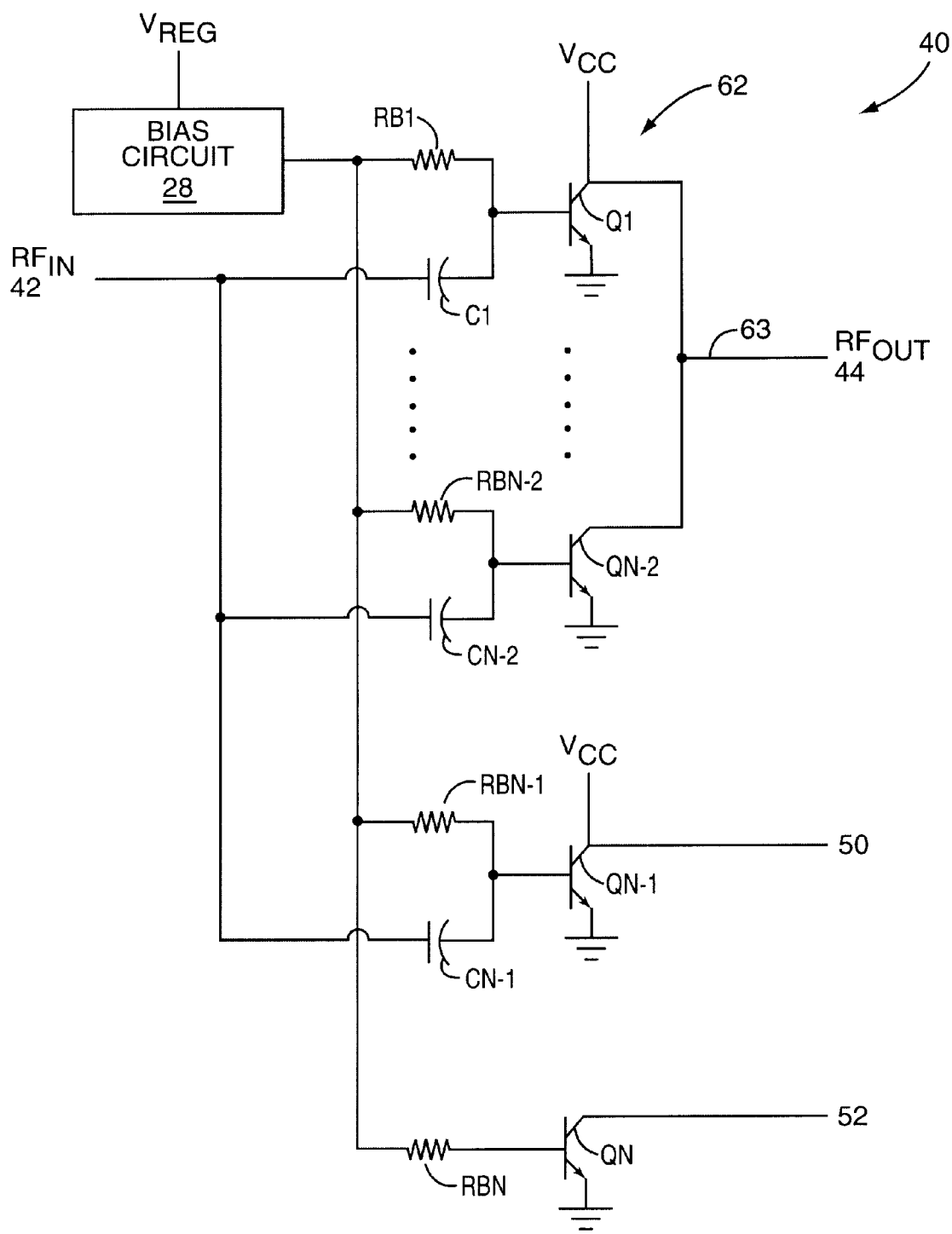
FIG. 3 illustrates a schematic diagram of power amplifier circuitry well-suited for use with the present invention.
Figure 4:
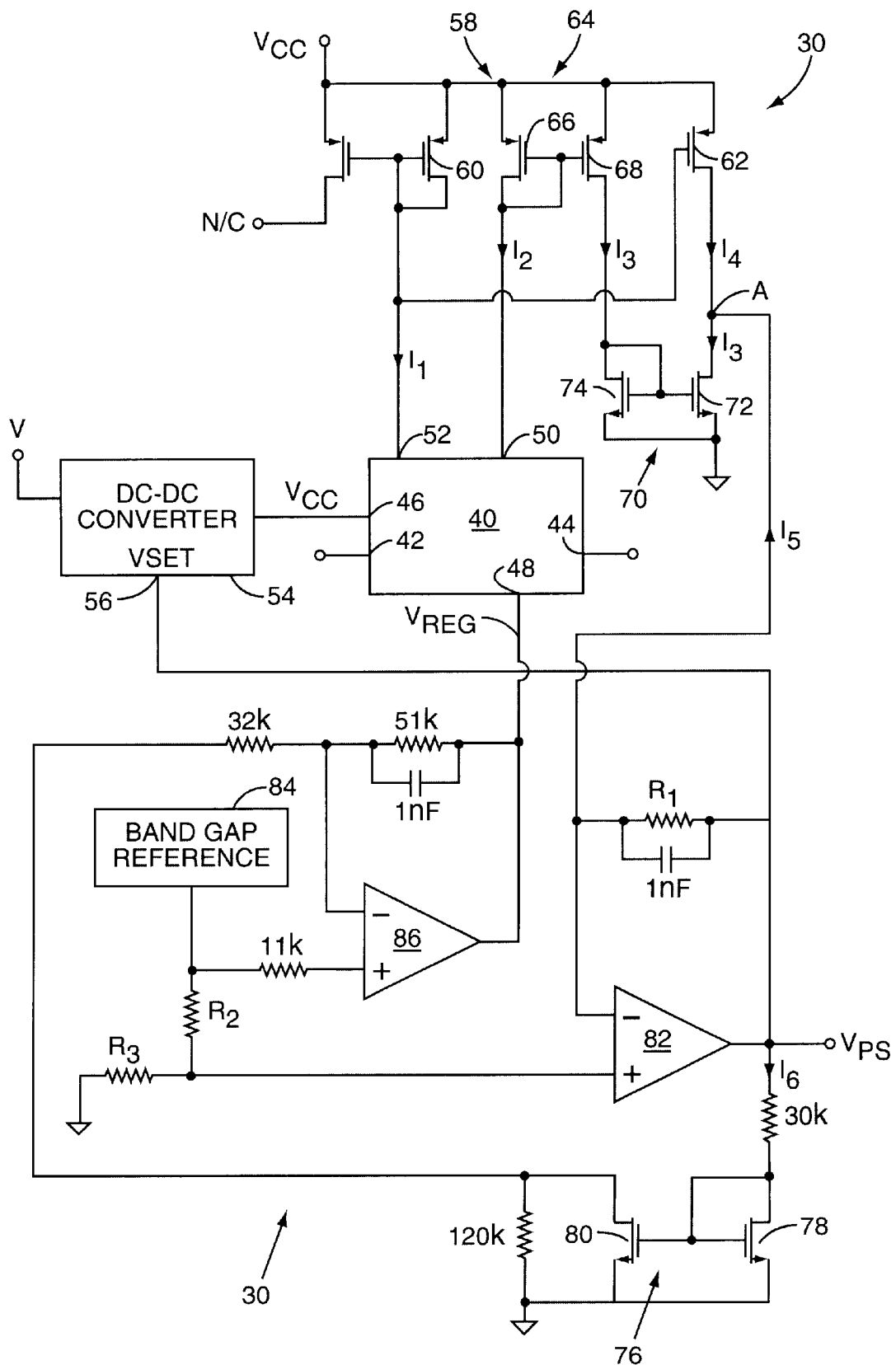
FIG. 4 illustrates a third embodiment of the present invention wherein the power is sensed from the power amplifier indirectly.

As illustrated in FIG. 3, the power amplifier 40 comprises an array of transistors Q1 to QN-2. Transistors QN-1 and QN are identical to transistors Q1 to QN-2. Transistors Q1 through QN-2 are used in the power amplifier 40 to amplify the $RF_{IN}$ signal. A single transistor, QN-1, also receives the $RF_{IN}$ signal and is used to provide a scaled version of the $RF_{OUT}$ signal as further explained below.

In this configuration, each transistor Q1 through QN-1 receives an identical bias set point from the bias circuit 28 through resistors RB1 through RBN-1, and also receives the $RF_{IN}$ signal (via RF input pin 42) through capacitors C1 through CN-1. Notably, the collectors of transistors Q1 through QN-2 are coupled together to provide a common output signal $RF_{OUT}$ at RF output pin 44, which is passed to the matching circuit 22 and the load of antenna 24.

The collector of transistor QN-1 is coupled to a power sensed output pin 50, and is not joined to the other collectors of transistors Q1 through QN-2. The signals at the collectors of transistors Q1 through QN-2 are combined to form an output signal A times that of the scaled output signal provided by transistor QN-1. A in this case equals N-2, derived from the fact that there are N-2 transistors in the array.

The transistor QN receives the bias set point from the bias circuit 28 in the same manner as the other transistors Q1 through QN-1, but does not receive the $RF_{IN}$ signal. Thus, the transistor QN only amplifies the bias set point and provides it at power sensed reference output 52.

The transistors Q1 through QN are preferably heterojunction bipolar transistors (HBTs) formed on a single semiconductor and equally sized to form a transistor array. However, the concepts of this chip are independent of technology (Si, GaAs, SiGe, etc.) as well as device type (BJT, FET, MESFET, HBT, etc.).

Further information pertaining to the transistor array illustrated in FIG. 3 may be found in commonly owned U.S. Pat. Nos. 5,608,353, and 5,629,648, which are incorporated herein by reference in their entirety. Exemplary bias circuits 28 capable of being used in association with the present invention are described in further detail in commonly owned U.S. patent application Ser. No. 09/467,415, entitled BIAS NETWORK FOR HIGH EFFICIENCY RF LINEAR POWER AMPLIFIER, filed Dec. 20, 1999, the disclosure of which is incorporated herein by reference in its entirety. Upon understanding the present invention, those skilled in the art will be able to construct any number of bias networks that are compatible with the present invention.

The present invention is particularly well-suited for use with the power amplifier 40 of FIG. 3, as illustrated in FIG. 4. As discussed above, the power amplifier 40 comprises an RF input pin 42, an RF output pin 44, a voltage supply input 46, a bias input pin 48, a power sensed output pin 50 and a power sensed reference output pin 52. The bias circuit 28 may be integrated into the power amplifier 40, and still preferably exhibits a linear response to the input bias voltage $V_{REG}$.

The RF input pin 42 receives the $RF_{IN}$ signal and passes it to the transistor cell array as described above. The RF output pin 44 takes the combined outputs of the collectors of the transistors in the transistor cell array and produces the $RF_{OUT}$ signal.

The output of the power sensed reference output pin 52 drives a current mirror 58 comprised of transistors 60 and 62 (separated on the schematic). Specifically, a current $I_1$ is produced and mirrored into the transistor 62 as $I_4$. Thus, $I_4=I_1$. Alternatively, the currents may be scales by the relative sizes of the transistors 60, 62 such that $I_4 \times I_1$. At the same time, the output of the power sensed output pin 50 drives a current mirror 64 comprised of transistors 66, 68. Specifically, a current $I_2$ is produced and mirrored into the transistor 68 as $I_3$. Thus, $I_3=I_2$.

$I_3$ flows into a current mirror 70 comprised of transistors 72, 74. This arrangement causes a copy of the amplified bias current to enter node A and a copy of the power-sense current (bias plus RF) to leave node A. This creates an analog subtraction function in node A and creates current $I_5$ equal to the difference of the output of the power sensed output pin 50 and the power sensed reference output pin 52. In effect, $I_5$ is a signal proportional to the $RF_{OUT}$ signal, albeit in a current form rather than a voltage. Current $I_5$ is supplied by the op-amp 82. The op-amp 82 provides this current by adjusting its output voltage $V_{PS}$ until the proper current flows through the feedback resistor $R_1$, which, in an exemplary embodiment, may be 15 kΩ. The 1 nF feedback capacitor in parallel with $R_1$ is to provide low-pass filtering. Output voltage $V_{PS}$, as a function of its being adjusted to provide the proper current $I_5$, proportional to the $RF_{OUT}$ signal.

The voltage supply input 46 receives a supply voltage ($V_{CC}$) from the DC-DC converter 54. The DC-DC converter 54 is, in an exemplary embodiment, a buck converter, and converts a battery voltage (V) to the supply voltage ($V_{CC}$) based on the input signal at VSET input 56.

As in the previous embodiments, the DC-DC converter 54 may alternatively be a buck-boost converter or a boost converter as needed or desired. In all cases, the DC-DC converter 54 creates a supply voltage $V_{CC}$ as a known function of the signal at VSET input 56. Thus, as output voltage $V_{PS}$ changes reflective of changes in the $RF_{OUT}$ signal, the signal applied to the VSET input 56 changes and supply voltage $V_{CC}$ changes. For example, as the $RF_{OUT}$ signal decreases, output voltage $V_{PS}$ decreases and supply voltage $V_{CC}$ applied to the power amplifier 40 decreases, thus improving efficiency and decreasing the drain on the battery.

Concurrently with the provision of output voltage $V_{PS}$ to the VSET input 56, a current $I_6$ is induced in a current mirror 76 comprised of transistors 78; 80. A 120 kΩ resistor is positioned across the transistor 80. The current $I_6$ mirrors across the transistors 78, 80 and is presented along with a signal from band gap reference 84 to an op-amp 86.

The band gap reference 84 may produce a voltage that is a function of the difference in current between two or more diodes. This acts as a floor voltage. In an exemplary embodiment, this is 1.07 volts.

The op-amp 86 compares the voltage from its inverting input to ground (the voltage across the 120 kΩ resistor and the 32 kΩ resistor) with the band-gap voltage and adjusts the input bias voltage $V_{REG}$ until they match. Thus, the input bias voltage $V_{REG}$ is a function of output voltage $V_{PS}$.

When the $RF_{OUT}$ signal is high, output voltage $V_{PS}$ drives the current mirror 76 hard enough to short the 120 kΩ resistor. The op-amp 86 measures the voltage across the 32 kΩ resistor and creates an input bias voltage $V_{REG}$ that, in turn, is provided to the bias input pin 48. When, however, the $RF_{OUT}$ signal is low or zero, the current mirror 76 is off, and the op-amp 86 generates a much lower input bias voltage $V_{REG}$ because of the large resistance (120 kΩ+32 kΩ) between the inverting input and ground. Between this minimum point and maximum point, input bias voltage $V_{REG}$ will scale according to the $RF_{OUT}$ signal and thus scale the bias set point of the bias circuit 28.

Note that a threshold voltage is also presented to the op-amp 82 through the voltage divider formed by $R_2$ and $R_3$. In an exemplary embodiment, $R_2=R_{32}=11$ kΩ, thus making the threshold voltage half the band gap value.

For the purposes of this embodiment, the control processing circuit 30 is somewhat diffuse, and comprises the elements downstream of pins 50, 52 and upstream of the DC-DC converter 54 and the bias input pin 48.

The end result of this arrangement is that as the power in the $RF_{OUT}$ signal is backed off, and the control processing circuit 30 provides signals proportional or reflective of the $RF_{OUT}$ signal to the bias circuit 28 and the DC-DC converter 26 so as to improve the efficiency of the power amplifier 40. Specifically, if the $RF_{OUT}$ signal is small, the voltage supplied to the voltage supply input pin 46 is small and the bias set point of the transistor cell array within the power amplifier 40 is small. Thus, as the supply voltage for the power amplifier is decreased, the bias for the amplifier is decreased in a manner enduring ensuring efficient operation. This results in greater efficiency. Further, this arrangement supports the required linearity over the entire power range needed for normal operation.

Those skilled in the art will recognize improvements and modifications to the preferred embodiments of the present invention. All such improvements and modifications are considered within the scope of the concepts disclosed herein and the claims that follow.

What is claimed is:

1. An amplifier circuit, comprising:
   power amplifier circuitry comprising
      an output providing an output signal associated with an output power;
      a voltage input to provide a supply voltage to said power amplifier circuitry; and
      a bias input;
   a DC-DC converter comprising a control input receiving a first signal reflective of said out power to control a supplied output voltage said supplied output voltage being provided to said voltage output;
   a bias circuit providing a bias signal to said bias input and receiving a second signal reflective of said output power to control the bias signal; and
   control processing circuitry for generating said first and second signals reflective of said output power, both proportional to said output power based on said output signal.

2. The amplifier circuit of claim 1, wherein said DC-DC converter comprises a buck converter.

3. The amplifier circuit of claim 1, wherein said control processing circuitry comprises at least one current mirror.

4. The amplifier circuit of claim 1, wherein said power amplifier circuitry comprises a second output providing a power reference signal.

5. The amplifier circuit of claim 4, wherein said control processing circuitry subtracts said power reference signal from said output signal to derive said first signal.

6. The amplifier circuit of claim 1 wherein said power amplifier comprises an array of transistor cells.

7. The amplifier circuit of claim 1 wherein said DC-DC converter scales power supplied to said power amplifier circuitry as a function of said second signal.

8. The amplifier circuit of claim 1 wherein said output signal associated with an output power is generated directly.

9. The amplifier circuit of claim 8 farther comprising a matching circuit operatively connected to said output.

10. The amplifier circuit of claim 9 wherein said output signal is generated from said output power prior to said matching circuit.

11. The amplifier circuit of claim 9 wherein said output signal is generated from said output power after said matching circuit.

12. The amplifier circuit of claim 1 wherein said output signal is generated indirectly.

13. The amplifier circuit of claim 12 wherein said power amplifier circuitry comprises a transistor cell array and a transistor in parallel with said array emulating an output of said array.

14. The amplifier circuit of claim 1 wherein said DC-DC converter comprises a boost converter.

15. The amplifier circuit of claim 1 wherein said DC-DC converter comprises a buck-boost converter.

16. A method of using a power amplifier circuit comprising:
   deriving a signal proportional to a power output signal from the power amplifier circuit;
   directing the signal to a DC-DC converter;
   scaling a power signal supplied by the DC-DC converter as a function of the signal;
   controlling the power amplifier circuit with the power signal supplied by the DC-DC converter and
   controlling a bias circuit with a second signal proportional to the power output signal.

17. The method of claim 16 wherein deriving a signal proportional to a power output signal from the power amplifier comprises subtracting a power reference signal from a power output signal, both said power reference signal and said power output signal being generated by said power amplifier.

18. The method of claim 16 wherein directing the signal to a DC-DC converter comprises directing the signal to a buck converter.

19. The method of claim 16 wherein controlling the power amplifier comprises controlling a transistor cell array within the power amplifier.

20. The method of claim 16 wherein deriving a signal proportional to a power output signal from the power amplifier comprises rectifying a sample of the power output signal.

21. The method of claim 20 wherein rectifying comprises rectifying with at least one diode.

22. The method of claim 16 wherein directing the signal to a DC-DC converter comprises directing the signal to a buck-boost converter.

23. The method of claim 16 wherein directing the signal to a DC-DC converter comprises directing the signal to a boost converter.

24. A method of using a power amplifier having a power sensed output and a power sensed reference output, comprising:
   subtracting said power sensed reference output from said power sensed output to derive a signal proportional to a power output signal generated by the power amplifier,
   controlling a supply voltage $V_{CC}$ of a DC-DC converter with the signal; and controlling the power amplifier with the supply voltage $V_{CC}$.

25. A power amplifier circuit comprising:
   a power amplifier comprising
      a transistor cell array;
      an RF input pin receiving an RF signal ($RP_{IN}$);
      an RF output pin producing an amplified version ($RF_{OUT}$) of the $RF_{IN}$ signal with said transister cell array;
      a bias input pin receiving an input bias voltage $V_{REG}$;
      a voltage supply input receiving a supply voltage $V_{CC}$;
      a bias circuit receiving input bias voltage $V_{REG}$ from said bias input pin and producing a bias set point for said transistor cell array as a linear fiction of input bias voltage $V_{REG}$;
   a control processing circuit receiving a signal reflective of the $RF_{OUT}$ signal and generating a second signal;
   a DC-DC converter for converting a battery voltage to supply voltage $V_{CC}$ and providing supply voltage $V_{CC}$ to said voltage supply input, said DC-DC converter generating supply voltage $V_{CC}$ as a function of said second signal; and
   said control processing circuit generating input bias voltage $V_{REG}$ as a function of said second signal.

* * * * *